(12) United States Patent
Lin et al.

(10) Patent No.: US 7,279,873 B2
(45) Date of Patent: Oct. 9, 2007

(54) CURRENT-LIMITED PROTECTION CIRCUIT OF SWITCHING POWER CONVERTER

(75) Inventors: Jiaun-Long Lin, Longtan Township, Taoyuan County (TW); Yen-Huang Lee, Hsinchu (TW); Jen-Chi Lo, Longtan Township, Taoyuan County (TW)

(73) Assignee: Chung Shan Institute of Science and Technology, Armaments Bureau, M.N.D., Taoyuan (TW)

( * ) Notice: Subject to any disclaimer, the term of this patent is extended or adjusted under 35 U.S.C. 154(b) by 411 days.

(21) Appl. No.: 10/922,629

(22) Filed: Aug. 19, 2004

(65) Prior Publication Data

US 2006/0038546 A1    Feb. 23, 2006

(51) Int. Cl.
*G05F 1/573* (2006.01)
(52) U.S. Cl. .................. 323/277; 323/284; 323/908
(58) Field of Classification Search .......... 323/222, 323/225, 276, 277, 282, 284, 908
See application file for complete search history.

(56) References Cited

U.S. PATENT DOCUMENTS

| | | | | | |
|---|---|---|---|---|---|
| 5,969,574 | A | * | 10/1999 | Legates | 330/288 |
| 6,163,136 | A | * | 12/2000 | Celenza | 320/164 |
| 6,201,417 | B1 | * | 3/2001 | Blum et al. | 327/14 |
| 6,828,762 | B2 | * | 12/2004 | Brkovic | 323/222 |

* cited by examiner

*Primary Examiner*—Jessica Han
(74) *Attorney, Agent, or Firm*—J.C. Patents

(57) ABSTRACT

A switching power converter comprises a switch, a pulse width modulation (PWM) circuit, a rectifying filter circuit and a current limited protection circuit. The input terminal of the rectifying filter circuit is coupled to an input voltage via the switch. The current limited protection circuit comprises an amplifier and a pulse-width modulator. The amplifier detects an induced voltage while a working current flows through the switching power converter, and amplifies the induced voltage so as to generate a comparison voltage. The pulse-width modulator receives an output from the amplifier, determines an output of the pulse-width modulator according the comparison voltage and a reference voltage, and limits the working current according to the output of the pulse-width modulator.

12 Claims, 5 Drawing Sheets

CURRENT-LIMITED PROTECTION CIRCUIT OF SWITCHING POWER CONVERTER

BACKGROUND OF THE INVENTION

1. Field of the Invention

The present invention relates to a current-limited protection circuit of a switching power converter, and more particularly to an amplifier for current-limited protection circuit of a switching power converter.

2. Description of the Related Art

FIG. 1 is a schematic circuit of a prior art switching power converter. Referring to FIG. 1, the first source/drain terminal of the switch transistor 101 is coupled to the input terminal of the switching power converter for receiving the input voltage Vin. The second source/drain terminal is coupled to the output terminal of the switching power converter via the series inductor 103a and resistor 103b. A terminal of the diode 107 is coupled to the second source/drain of the switch transistor 101, and another terminal of the diode 107 is grounded via the resistor 109. The output terminal of the switching power converter is grounded via the capacitor 111. The output voltage Vo drops on the two terminals of the capacitor 111.

Referring to FIG. 1, the pulse-width modulator 130 comprises a current-limited comparator 131 having the positive-voltage and the negative-voltage terminals coupled to the two terminals of the resistor 109. The positive-voltage input terminal of the current-limited comparator 131 is coupled to a terminal of the resistor 109 via the reference voltage Vf. The current-limited comparator 131 is coupled to the direct current (DC) voltage Vc so that the pulse-width modulator 130 operates normally. The output terminal of the current-limited comparator 131 is coupled to the gate terminal of the switch transistor 101 via the output terminal of the current-limited comparator 131.

In the switching power converter of FIG. 1, the voltage Vr dropped on the resistor 109 depends on the current flowing therethrough. When the working current I flowing through the switch transistor 101 is high, the current flowing through the resistor 109 also increases. When the voltage Vr dropped on the resistor 109 is higher than a preset voltage, the pulse-width modulator 130 turns off the switch transistor 101. The current I flowing through the switching power converter declines so that circuit protection can be achieved.

However, the prior art switching power converter has disadvantages. In order to resolve the heat dissipation problem, the size of the resistor 109 should be increased. Due to the increase of the size of the resistor 109, the size of the integrated circuit also increases. In order to prevent reducing the resistance of the resistor 109 resulting from the power dissipation, the resistance of the resistor 109 should be smaller. For fabricating a resistor with a precise and small resistance, the manufacturing costs increase.

U.S. Pat. No. 5,982,160 (Walters et. al.) discloses a DC-to-DC converter with inductor current sensing and related methods. The method comprises: sensing current passing through the inductor using a current sensor connected in parallel with the inductor, the current sensor comprising a resistor and a capacitor connected together in series; and operating the peak current control loop circuit to control the at least one power switch responsive to the current sensor. The method applies a DC voltage and AC voltage for the induced voltage, wherein the DC voltage is higher than the AC voltage. While the induced voltage is amplified, the DC voltage should be filter out and the AC voltage should be amplified due to its low value. The method is complicated.

SUMMARY OF THE INVENTION

Accordingly, the present invention is directed to a switching power converter for reducing power consumptions.

The present invention is also directed to a switching power converter, which efficiently shrinks the size of the circuit.

The present invention is directed to a protection circuit of a switching power converter for various pulse-width modulators so as to perform current-limited protection for the switching power converter.

The present invention discloses a current-limited protection circuit of a switching power converter, comprising an amplifier and a pulse-width modulator. The amplifier detects an induced voltage while a working current flows through the switching power converter, and amplifies the induced voltage so as to generate a comparison voltage. The pulse-width modulator receives an output from the amplifier, determines an output of the pulse-width modulator according the comparison voltage and a reference voltage, and modulates the working current according to the output of the pulse-width modulator.

In the embodiment of the present invention, the pulse-width modulator comprises a current-limited comparator having a voltage terminal coupled to the reference voltage and another voltage terminal receiving the output from the amplifier. An output terminal of the current-limited comparator is coupled to the input of the pulse-width modulator.

The switching power converter comprises a switch transistor and an inductor. The switch transistor has a first source/drain terminal coupled to an input voltage, and a gate terminal coupled to the output of the pulse-width modulator. The inductor has a terminal coupled to a second source/drain terminal of the switch transistor, and another terminal coupled to an output of the switching power converter. The switching power converter further comprises a resistor and a first capacitor. The resistor has a terminal coupled to the second source/drain terminal of the switch transistor, and another terminal coupled to a first input terminal of the amplifier. The first capacitor has a terminal coupled to the first input terminal of the amplifier, and another terminal coupled to a second input terminal of the amplifier and to the output terminal of the pulse-width modulator. The induced voltage drops on these two terminals of the first capacitor.

In the embodiment of the present invention, the switching power converter further comprises a diode and a second capacitor. The diode has an n-type terminal coupled to the second source/drain terminal of the switch transistor, and a p-type terminal grounded. The second capacitor grounds the output terminal of the switching power converter.

In the embodiment of the present invention, the amplifier is a high impedance differential amplifier circuit and add an adjustable pole.

The present invention also discloses a switching power converter, comprising a switch, a switching power circuit and a current-limited protection circuit. The output of the switching power circuit is coupled to an input voltage via the switch. The current-limited protection circuit comprises an amplifier and a pulse-width modulator. The amplifier detects an induced voltage while a working current flows through the switching power converter and amplifies the induced voltage so as to generate a comparison voltage. The pulse-width modulator receives an output from the amplifier and determines an output of the pulse-width modulator according comparison of the comparison voltage and the reference voltage, wherein turn-on of the switch depends on the output of the pulse-width modulator.

Accordingly, the present invention uses the amplifier for amplifying the induced voltage dropped on these two terminals of the first capacitor. Without a great induced voltage, the output of the pulse-width modulator can be controlled so as to control the working current. With the requirement of a low induced voltage, the resistor can have a low resistance so as to reduce power consumptions and shrink the size of circuit. By modifying the gain of the amplifier, the induced voltage can be amplified. Therefore, the present invention is adapted for various pulse-width modulators.

The above and other features of the present invention will be better understood from the following detailed description of the preferred embodiments of the invention that is provided in communication with the accompanying drawings.

DESCRIPTION OF SOME EMBODIMENTS

Figure 1:
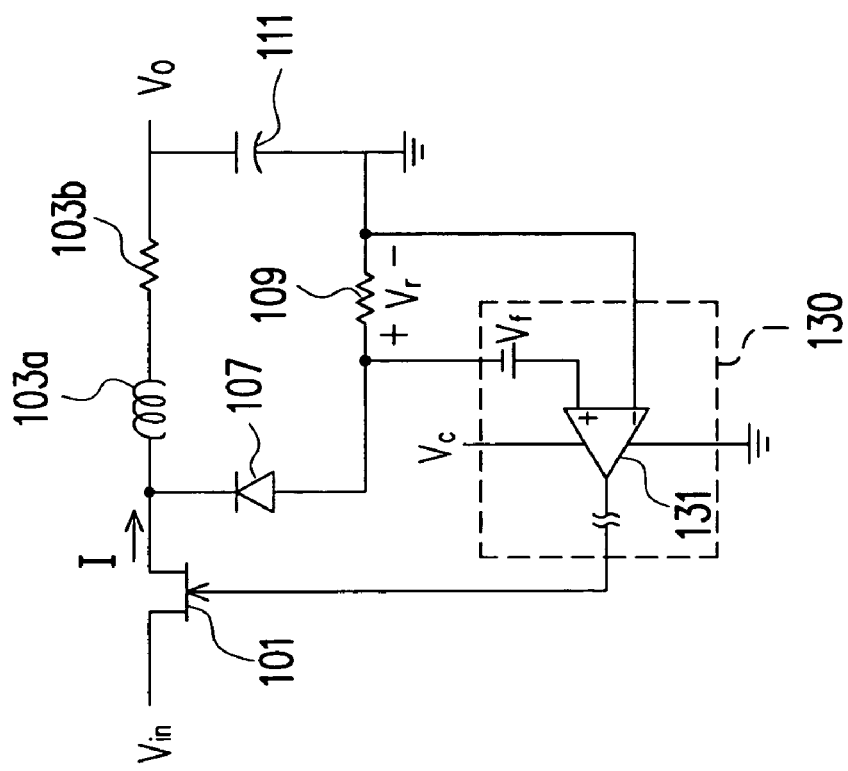
FIG. 1 is a schematic circuit of a prior art switching power converter.
Figure 2:
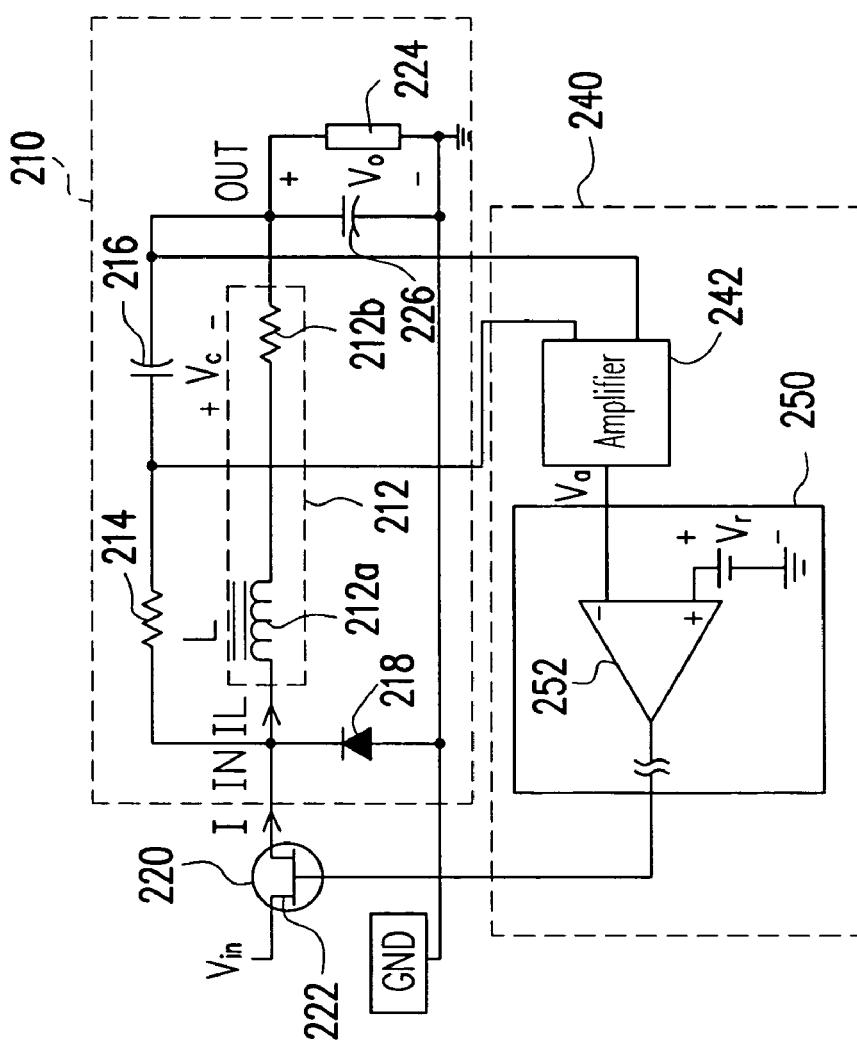
FIG. 2 is a schematic circuit showing a switching power converter according to an embodiment of the present invention.

FIG. 2 is a schematic circuit showing a switching power converter according to an embodiment of the present invention. Referring to FIG. 2, the input of the switching power converter 200 is coupled to the input voltage Vin via the switch 220. Then the switching power circuit 210 converts the input voltage Vin into the output voltage Vo via the switch 220 for driving a load 224. The switching power circuit 210 is coupled to the input terminal of the current-limited protection circuit 240. The switch 220 determines whether to transmit the input voltage Vin to the input IN of the switching power circuit 210 according to the output of the current-limited protection circuit 240.

Referring to FIG. 2, the switch 220 comprises, for example, an NMOS switch transistor 222. The first source/drain terminal of the switch transistor 222 is coupled to the input voltage Vin, and the second source/drain terminal is coupled to the input terminal IN of the switching power circuit 210. The gate terminal of the switch transistor 222 is coupled to the output terminal of the current-limited protection circuit 240.

In the switching power converter 210, a terminal of the inductor 212 is coupled to the input IN of the switching power circuit 210, and another terminal is coupled to the output OUT of the switching power circuit 210. A terminal of the resistor 214 is also coupled to the input terminal IN of the switching power circuit 210, and another terminal is coupled to the output OUT of the switching power circuit 210 via the first capacitor 216.

The switching power circuit 210 further comprises a diode 218 and a second capacitor 226. The n-type terminal of the diode 218 is coupled to the input voltage Vin via the switch 220, and the p-type terminal is grounded. The output OUT of the switching power circuit 210 is grounded via the second capacitor 226. The output voltage Vo drops on these two terminals of the second capacitor 226 for driving the load 224.

In the current-limited protection circuit 240, the first input terminal and the second input terminal of the amplifier 242 are coupled to the two terminals of the first capacitor 216 for receiving the induced voltage Vc while the working current I flows through the switching power circuit 210. The amplifier 242 amplifies the induced voltage Vc and outputs the comparison voltage Va to the pulse-width modulator 250.

In some embodiments, the pulse-width modulator 250 can be, for example, an integrated circuit.

The pulse-width modulator 250 comprises a current-limited comparator 252. A terminal (e.g. the negative-voltage terminal) is coupled to the output of the amplifier 242; and another terminal (e.g. the positive-voltage terminal) is coupled to the reference voltage Vr.

Referring to FIG. 2, the negative-voltage terminal is coupled to the output of the amplifier 242 for receiving the comparison voltage Va, and the positive-voltage terminal is coupled to the reference voltage Vr. According to the comparison of the comparison voltage Va and the reference voltage Vr, the current-limited comparator 252 controls the output of the pulse-width modulator 250 so as to determine whether to turn on the switch 220.

Under normal operation, the first capacitor 216 induces the induced voltage Vc. After amplifying by using the amplifier 242, the comparison voltage Va is smaller than the reference voltage Vr. The current-limited comparator 252 controls the output of the pulse-width modulator 250 so as to normal operation of the switch 220. Then the input voltage Vin charges the inductor 212. If the working current is too great, the induced voltage Vc also arises. After amplifying by using the amplifier 242, the comparison voltage Va also increases. When the comparison voltage Va is greater than the reference voltage Vr, the current-limited comparator 252 controls the output of the pulse-width modulator 250 so as to turn off the switch 220. Input voltage Vin at this moment and does not offer the current to inductor 212, the induced voltage Vc will drop, and the comparison voltage Va will decline via the amplifier 242, comparison voltage Va smaller than reference voltage Vr, limit current comparator 252 will control limit is it protect circuit 250 output to flow, make switch 220 operate normally, Vin continues offering the electric current to inductor 212, but the current that flows through is still very big, it is enough to make switch 220 close again. Go round and begin again and operate so, it is that 'pulse-by-pulse current limit', its purpose is suppressing the biggest electric current flowing through switch 220, it is safe in order to protect the switching power converter.

Referring to FIG. 2, the equivalent inductor 212 comprises an inductor 212a and a resistor 212b, wherein the inductor 212a has an inductance L, and the resistor 212b has a resistance RL. The relationship between the resistance RL of the resistor 212b and the current IL flowing through the inductor 212a is shown as below:

$$Vc \approx IL \times RL$$

In order to reduce power consumptions of the switching power converter, the resistance RL of the resistor 212b can be reduced. Due to the reduction of the resistance RL of the resistor 212b, the induced voltage Vc also declines. If the pulse-width modulator 250 directly receives the induced voltage Vc, the working current I may damage the switching power converter 200 before the induced voltage Vc becomes greater than the reference voltage Vr.

Thean the reference voltage Vr. Ther 242 for amplifying the induced voltage Vc so as to generate the comparison voltage Va. By modifying the gain of the amplifier 242, the pulse-width modulator 250 turns off the switch 220 before the working current becomes larger without damaging the circuit.

Figure 3:
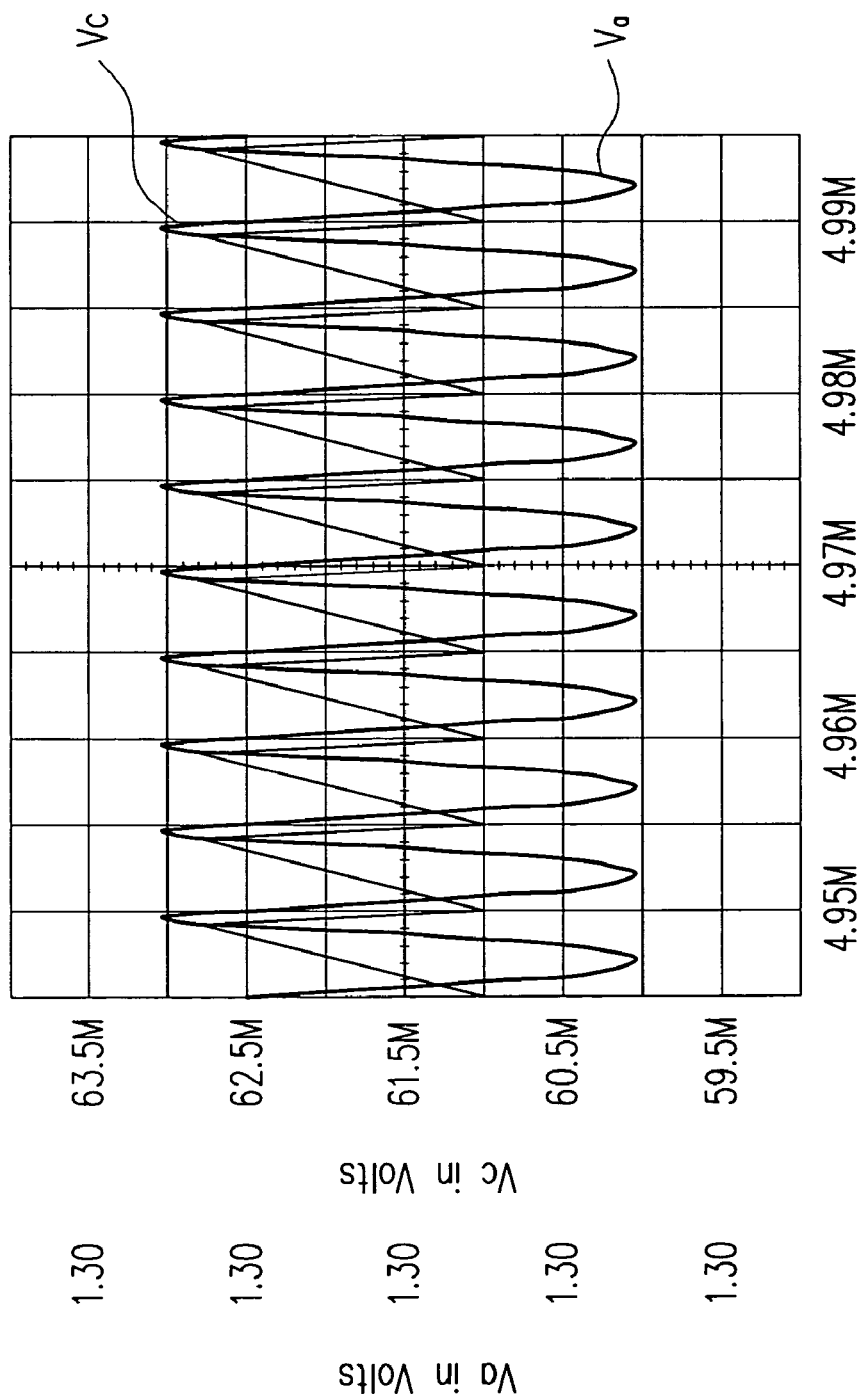
FIG. 3 is curves of the induced voltage Vc and the comparison voltage Va according to FIG. 2.

FIG. 3 is waveforms of the induced voltage Vc and the comparison voltage Va according to FIG. 2. Referring to FIG. 3, the small induced voltage Vc is amplified by the amplifier 242 by several folds so as to generate the comparison voltage Va.

Figure 4:
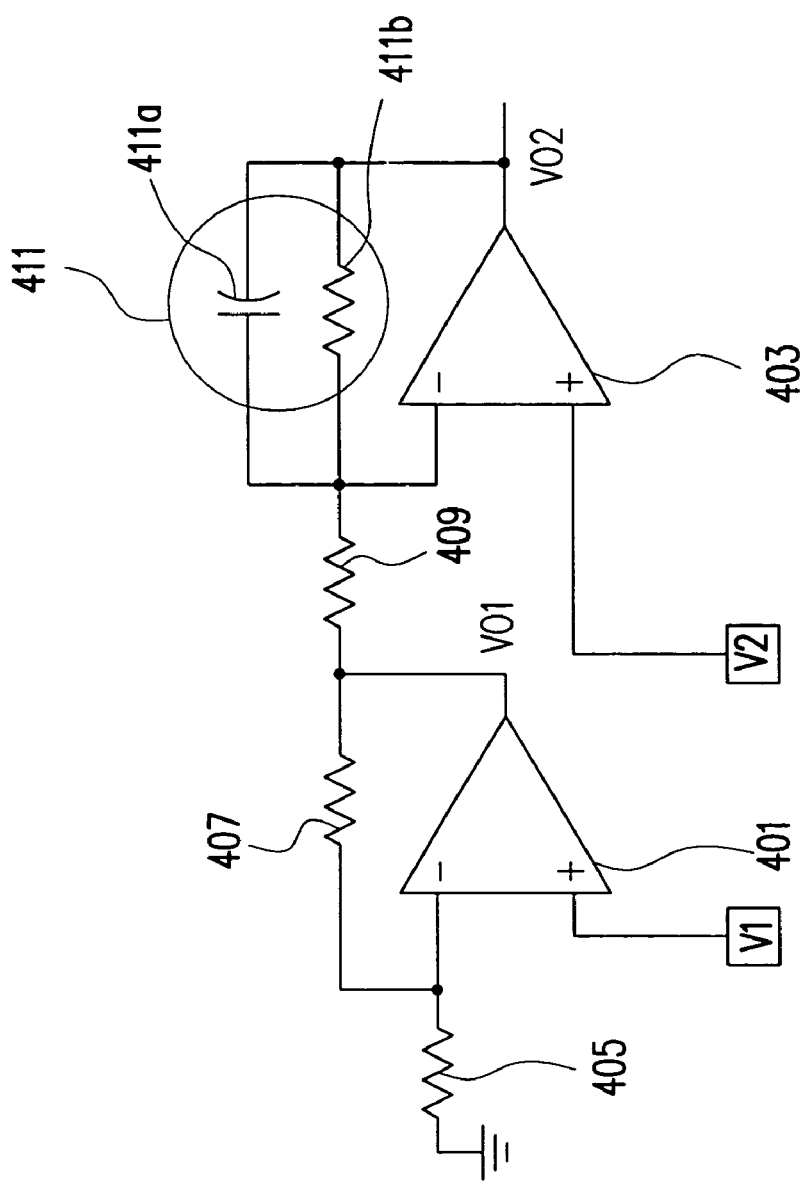
FIG. 4 is a schematic circuit of an amplifier according to an embodiment of the present invention.

FIG. 4 is a schematic circuit of an amplifier according to an embodiment of the present invention. Referring to FIG. 4, the amplifier either amplifies the induced voltage signal, or screens high-frequency noises (in the light of the operation frequency of switching converter)

The amplifier in FIG. 4 can be, for example, a differential amplifier circuit, comprising operation amplifiers 401 and 403. The negative-voltage input terminal of the operation amplifier 401 is grounded via the resistor 405, and coupled to the output terminal VO1 via the resistor 407. The negative-voltage input terminal of the operation amplifier 403 is coupled to the output terminal VO1 of the operation amplifier 401 via the resistor 409, and coupled to the output terminal VO2 via a pole providing circuit 411.

The output terminal VO2 of the operation amplifier 403 is coupled to, for example, the input terminal of the pulse-width modulator 250 in FIG. 2. The positive-voltage input terminals of the operation amplifiers 401 and 403 are coupled to the two terminals of the first capacitor 216 in FIG. 2 for receiving the induced voltage Vc. Theoretically, the input impedances of the operation amplifiers 401 and 403 are unlimited. Though not really unlimited, the impedances are still so high that almost mirror the induced voltage Vc, and not affect by the effection of loading.

Referring to FIG. 4, the pole providing circuit 411 comprises a capacitor 411a and a resistor 411b, which are parallel coupled to each to each other. The pole providing circuit 411 provides a pole so that the differential amplifier circuit has the features as does a low-pass filter. Accordingly, the efficiency of screening high-frequency noises is improved.

Figure 5:
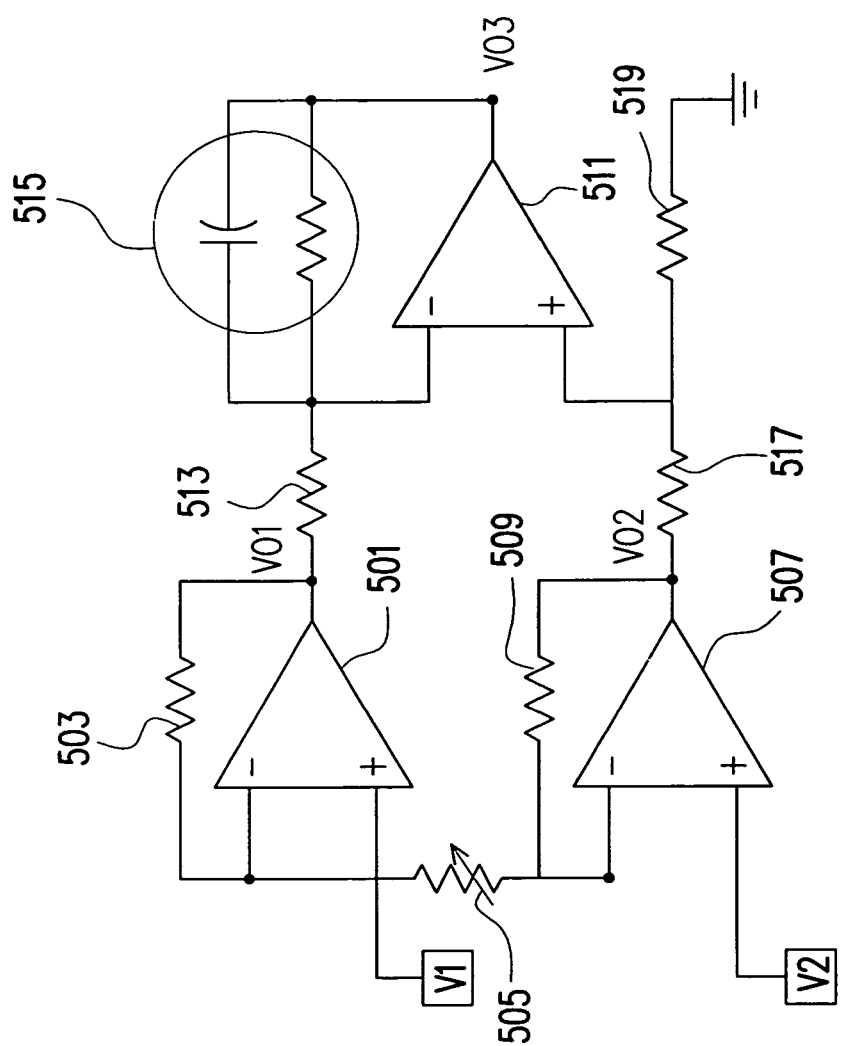
FIG. 5 is a schematic circuit of another amplifier according to an embodiment of the present invention.

FIG. 5 is a schematic circuit of another amplifier according to an embodiment of the present invention. Referring to FIG. 5, the amplifier is a differential amplifier circuit and similar to that described in FIG. 4.

Referring to FIG. 5, the negative-voltage input terminal of the operation amplifier 501 is coupled to the output terminal VO1 via the resistor 503, and coupled to the negative-voltage input terminal of the operation amplifier 507 via the variable resistor 505. The negative-voltage input terminal of operation amplifier 507 is coupled to the output terminal VO2 via the resistor 509. The positive-voltage input terminals of the operation amplifiers 501 and 507 are coupled to the two terminals of the first capacitor 216 in FIG. 2 for receiving the induced voltage Vc.

The negative-voltage input terminal of the operation amplifier 511 is coupled to the output terminal VO1 of the operation amplifier 501, and coupled to the output terminal VO3 via the pole providing circuit 515. The pole providing circuit 515 in FIG. 5 is similar to that described in FIG. 4. Detailed descriptions are not repeated. The positive-voltage input terminal is coupled to the output terminal VO2 of the operation amplifier 507 and the ground terminal via the resistors 517 and 519, respectively.

The differential amplifier circuit of the present invention modifies the gain of the differential amplifier circuit by modifying the resistance of the variable resistor 505. Accordingly, the differential amplifier circuit in FIG. 5 can be applied to various pulse-width modulators.

Though two differential amplifier circuits are provided in FIGS. 4 and 5, the present invention, however, is not limited thereto. One of ordinary skill in the art will understand that the design of the amplifier can be based on the practical requirements. The modification of the specifications of the amplifier still falls into the scope of the invention.

Accordingly, the present invention has following advantages:

1. In the present invention, the amplifier amplifies the induced voltage so as to reduce the equivalent resistance of the inductor 212 without impacting the purpose for circuit protection.
2. By the reduction of the resistance of the inductor of the preset invention, the power consumptions are reduced.
3. It is relative and very low because of the power consumption of this invention, needn't increase the heat dissipation device extraly, but enable the volume of the circuit to shrink.
4. Only by modifying the gain of the amplifier can the comparison voltage be changed. Accordingly, the present invention can be applied to various pulse-width modulators.
5. The differential amplifier circuit of the present invention has a high input impedance and provides an adjustable pole during controlling the circuit. Either amplifies the induced voltage signal precisely, or screens high-frequency noises (in the light of the operation frequency of switching converter).

Although the present invention has been described in terms of exemplary embodiments, it is not limited thereto. Rather, the appended claims should be constructed broadly to include constructed broadly to include of the invention which may be made by those skilled in the field of this art without departing from the scope and range of equivalents of the invention.

What is claimed is:

1. A current-limited protection circuit of a switching power converter, comprising:
    an amplifier detecting an induced voltage while a working current flows through the switching power converter, wherein a negative-voltage input terminal of the amplifier is coupled to an output terminal of the amplifier via a pole providing circuit so that the amplifier comprises a pole; and
    a pulse-width modulator receiving an output from the amplifier, determining an output of the pulse-width modulator according to a comparison voltage and a reference voltage, and limiting the working current according to the output of the pulse-width modulator.

2. The current-limited protection circuit of a switching power converter of claim 1, wherein the pulse-width modulator comprises a current-limited comparator having a voltage terminal coupled to the reference voltage and another voltage terminal receiving the output from the amplifier, and an output terminal of the current-limited comparator is coupled to an input terminal of the switching power converter.

3. The current-limited protection circuit of a switching power converter of claim 1, wherein the switching power converter comprises:

a switch transistor having a first source/drain terminal coupled to an input voltage, and a gate terminal coupled to an output terminal of the pulse-width modulator;

an inductor having a terminal coupled to a second source/drain terminal of the switch transistor, and another terminal coupled to an output terminal of the switching power converter;

a resistor having a terminal coupled to the second source/drain terminal of the switch transistor, and another terminal coupled to a first input terminal of the amplifier; and a first capacitor having a terminal coupled to the first input terminal of the amplifier, and another terminal coupled to a second input terminal of the amplifier and to the output terminal of the pulse-width modulator, the induced voltage existing on the first capacitor.

4. The current-limited protection circuit of a switching power converter of claim 3, wherein the inductor comprises an equivalent resistance.

5. The current-limited protection circuit of a switching power converter of claim 3, wherein the switch power modulator further comprises:

a diode having an n-type terminal coupled to the second source/drain terminal of the switch transistor, and a p-type terminal grounded; and a second capacitor connecting the output terminal of the switching power converter and ground.

6. The current-limited protection circuit of a switching power converter of claim 1, wherein the amplifier comprises a differential amplifier circuit.

7. A switching power converter, comprising:

a switch;

a switching power circuit having an input terminal coupled to an input voltage via the switch; and a current-limited protection circuit, comprising:

an amplifier detecting an induced voltage while a working current flows through the switching power converter and amplifying the induced voltage so as to generate a comparison voltage, wherein a negative-voltage input terminal of the amplifier is coupled to an output terminal of the amplifier via a pole providing circuit so that the amplifier comprises a pole; and a pulse-width modulator receiving an output from the amplifier and determining an output of the pulse-width modulator according to comparison of the comparison voltage and a reference voltage, wherein normal operating of the switch depends on the output of the pulse-width modulator.

8. The switching power converter of claim 7, wherein the pulse-width modulator comprises a current-limited comparator having a voltage terminal coupled to the reference voltage and another voltage terminal receiving the output from the amplifier, and the an output terminal of the current-limited comparator is coupled to an input terminal of the switching power converter.

9. The switching power converter of claim 7, wherein the switch comprises a transistor having a first source/drain terminal receiving the input voltage, a second source/drain terminal coupled to the output terminal of the switching converter via the series inductor and a gate terminal coupled to an output terminal of the pulse-width modulator.

10. The switching power converter of claim 7, wherein the switching power circuit comprises:

an inductor comprising an equivalent resistance, having a terminal coupled to the input voltage via the switch, and another terminal coupled to an output terminal of the switching power converter;

a resistor having a terminal coupled to the input voltage, and another terminal coupled to a first input terminal of the amplifier; and a first capacitor having a terminal coupled to the first input terminal of the amplifier, and another terminal coupled to a second input terminal of the amplifier and to the output terminal of the switching power circuit, the induced voltage existing on the first capacitor.

11. The switching power converter of claim 10, wherein the switching power converter further comprises:

a diode having an n-type terminal coupled to the input voltage, and a p-type terminal grounded; and a second capacitor grounding the output terminal of the switching power circuit.

12. The switching power converter of claim 7, wherein the amplifier comprises a differential amplifier circuit.

* * * * *